United States Patent [19]
Leyendecker et al.

[11] Patent Number: 5,272,014
[45] Date of Patent: Dec. 21, 1993

[54] WEAR-RESISTANT COATING FOR SUBSTRATE AND METHOD FOR APPLYING

[75] Inventors: Toni Leyendecker, Aachen; Stefan Esser, Würselen; Oliver Lemmer, Aachen, all of Fed. Rep. of Germany

[73] Assignee: Dr.-Ing. Toni Leyendecker, Aachen, Fed. Rep. of Germany

[21] Appl. No.: 382,993

[22] Filed: Jul. 21, 1989

[30] Foreign Application Priority Data

Jul. 23, 1989 [DE] Fed. Rep. of Germany ....... 3825399

[51] Int. Cl.$^5$ ...................... B32B 15/00; C23C 16/00
[52] U.S. Cl. ................... 428/457; 427/569; 427/574; 427/576; 427/578; 427/585
[58] Field of Search ............... 428/457, 192; 427/569, 427/574, 576, 578, 585

[56] References Cited

PUBLICATIONS

Knotek et al., "On the Structure of (Ti, Al)N–PVD Coatings," J. Solid State Chem., 70:318–322 (1987).
Knotek et al., "Industrial Deposition of Binary, Ternary and Quaternary Nitrides of Titanium, Zirconium, and Aluminum," J. Vac. Sci. Technol. A 5:2173–2179 (1987).
Knotek, et al., "On Structure and Properties of Sputtered Ti and Al Based Hard Compound Films," J. Vac. Sci. Techn. A, 4:2695–2700 (1986).
Knotek, et al., "On the Wear Behaviour of PVC Ti, Al, Zr, V, N Coatings," Wear of Materials 2:551–556 (1987).
Knotek, et al., "On the Properties of Physically Vapour-Deposited Ti–Al–V–N Coatings," Thin Solid Films 153:83–90 (1987).
Knotek, et al., "Quantitative ESMA bei der Entwicklung neuer PVD-Hartstoffbeschichtungen," Beitr. elektronenmikroskop. Direktabb. Oberfl. 19:211–218 (1986), (Abstract in English).

*Primary Examiner*—Thomas J. Herbert, Jr.
*Attorney, Agent, or Firm*—Banner, Birch, McKie and Beckett

[57] ABSTRACT

A multi-component, metal-containing, wear-resistant coating which is not homogeneous. The coating has a difference of a metallic element concentration of at least about 2 atom percent between the edges of the coating surface and the coating surface remote from the edge. Non-homogeneous coatings of the invention are surprisingly wear-resistant compared to homogeneous coatings.

The invention also relates to a method of applying the coatings of the invention by a PVC-process or a plasma-CVD-process wherein the electrical potential difference between the substrate and the ionized coating material is selected to enhance the inhomogeneity of the coating.

18 Claims, 1 Drawing Sheet

WEAR-RESISTANT COATING FOR SUBSTRATE AND METHOD FOR APPLYING

BACKGROUND OF THE INVENTION

1. Field of the Invention

The invention relates to a wear-restistant PVD-coating (Physical-Vapor-Deposition Coating) or Plasma-CVD coating (Chemical-Vapor-Deposition Coating) for a substrate such as a forming tool or a component thereof. The invention further relates to a method for applying the coating to a substrate.

2. Description of Related Art

Wear resistant hard coatings are used to improve the performance of forming tools, such as milling tools, punch tools, drills and other punching and cutting tools as well as components which are subjected to wear. Such coatings typically are thin (several micrometers) films, yet afford a considerable improvement of the wear resistance of tools and components to which the coating is applied. The hard coatings comprise one or several metalloids such as oxygen, nitrogen, carbon, boron, or silicon, and one or several metal elements. Despite the relatively high costs of these hard coatings, their use can be economically justified in certain applications by the significant improvement in wear resistance they offered.

These hard films typically are applied to substrate in a vacuum chamber in which a plasma, i.e. a particle vapor consisting of ions, is urged onto the substrate by an electrical field or with the aid of a magnetron field. These processes are also known as magnetron sputtering or sputter ion plating. The plasma is generated by impinging an electric arc, an electron beam, or a stream of rare gas ions onto a cathode, also known as a target, made of material from which the ions are formed. Depending on the process used, a liquid phase maybe formed during the plasma generation.

The vacuum chamber also may contain a reactive gas which becomes a component of the hard coating. If the plasma is created in a vacuum chamber into which the components of the hard coating are introduced in the gas phase, the process is as the known as the Plasma-CVD-process.

Initially, titanium nitrides were used to form the hard film. A marked improvement in wear resistance was achieved over high speed steels and hard metals. Further development of these hard coatings revealed that better results may be achieved when multi-metallic hard compounds are used. Examples of such multi-metallic coating include coatings of aluminium, titanium, and nitrogen, or of zirconium, titanium, and nitrogen. These coatings may be supplemented with other metals or metalloids to make the coating more stable.

Both the plasma-CVD coating process and the PVD coating process may yield an inhomogeneity at the edges of the coating. The conditions under which and the mechanism by which this inhomogeneity occurs are understood. Traditionally, coating process conditions were adjusted that a homogeneous coating was formed and the inhomogeneity was avoided, as it was believed that a homogeneous coating afforded superior performance.

Vaporized particles (ions) having the desired coating composition are urged from the vapor phase onto the substrate by application of an electrical field or with the aid of a magnetron field, which enhances the effect of a normal electrical field by superimposing a magnetic field thereon. The electrical field is generated by reducing the electric potential of the substrate below that of the plasma. The electrical or electrical/magnetic field has a higher charge density at the edges than in the center, i.e., at regions away from the edges. The higher charge density creates a stronger electrical field at the edge, which leads to a concentration of the particle flux in this area. The higher flux concentration causes the substrate to be more intensively hit at the edges by ions of all sorts, including the ionized particles of the hard film to be coated onto the substrate, target ions, and the carrier ions, such as argon ions, during target sputtering with the aid of carrier gas. These argon ions have the effect of compressing those particles of the hard film which have been deposited onto the substrate.

The edge effect caused by the electrical field is proportional to the strength of the electrical field applied. Therefore, known coating techniques utilize a relatively weak electric field to prevent inhomogeneity at the edges of the substrate. To compensate for this weak electrical field, the plasma in the vacuum chamber is very strongly ionized. Thus, a coating which is homogeneous throughout is obtained.

SUMMARY OF THE INVENTION

The invention relates to a multi-component, wear-resistant coating with more than one metallic element which is not homogeneous. The coating has a deficiency of one metallic element of at least about 3 atom percent at the edges of the coating surface. Non-homogeneous coatings of the invention are surprisingly more wear-resistant compared to homogeneous coatings.

The invention also relates to a method of applying the coatings of the invention by a PVD-process or a plasma-CVD-process wherein the electrical potential difference between the substrate and the ionized coating material is selected to enhance the inhomogeneity of the coating.

DETAILED DESCRIPTION OF THE INVENTION

Figure 1:
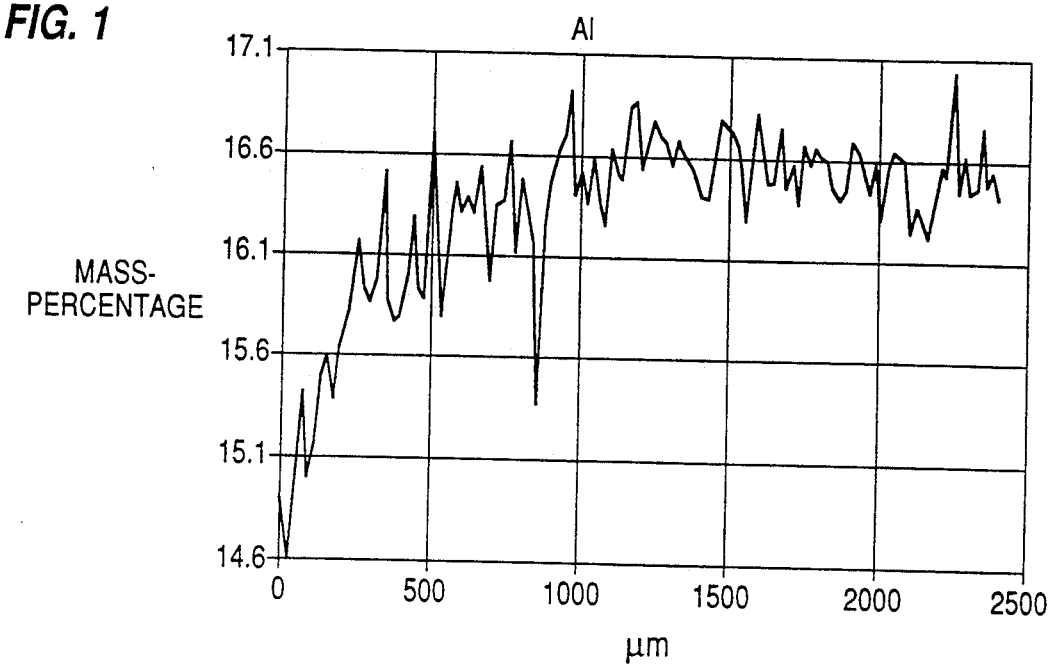
FIG. 1 illustrates the increase in aluminium concentration from an edge to the center of a cube surface coated in accordance with the method of the invention.

This invention is based on the discovery that a non-homogeneous, at-least-two-metal-containing, multi-component, wear-resistant coating having a metal concentration difference between an edge and the remainder of the coating of at least about 2 atom percent is surprisingly durable and wear-resistant. It also has been discovered that the coating of the invention can be applied to a substrate by a PVD-process by selecting the electrical potential difference between the substrate and the ionized coating material to enhance the inhomogeneity of the coating.

Throughout the specification and claims, the phrase "forming tool" means cutting tools, milling tools, shaping tools, punches, drills, and similar apparatus. It also refers to components of these apparatus which have an edge or a surface which is subjected to wear during use, and for which wear resistance is desired.

Most surprisingly, it has been discovered that when the non-homogeneity in the coating is produced at a surface of a substrate, which is subject to wear, such as an edge of a forming tool or a component thereof, hard coatings which are much more wear resistant than homogeneous coatings are produced, even though there is a stoichiometric deficiency of one metal of the composition in these areas. The non-homogeneity of the coating at the edge subject to wear compared to regions distant from the edge is quantified by a concentration difference of the metallic components of the hard compound system.

Although the inventors do not wish to be bound by this theory, it is believed that the conditions under which a non-homogeneous coating is prepared, i.e., the presence of ions in a strong electrical field which has a significant edge effect, afford a higher rate of ion bombardment at the edge. It is believed that the high rate of bombardment with ions (metal ions, reactive gas ions, carrier gas ions, and free electrons) subjected to a large driving force, i.e., a strong electric field or resulting from a significant difference in potential between the ions and the substrate, causes densification of the coating and displacement of lower molecular weight compounds. Thus, a densified, surprisingly wear-resistant coating deficient in at least one lower molecular weight metallic component at an edge subject to wear is produced.

The hard coating is densified in edge areas to a greater degree than in the areas remote from the edge, at the expense of a stoichiometrically balanced composition. The disadvantages caused by the inhomogeneity are more than compensated for by the advantages due to the extra densification and improved adherence of the hard film at the stoichiometrically-imbalanced non-homogeneous coating areas resulting therefrom. Substrates coated according to the invention, wherein the stoichiometrically deficient, densified coating is applied to an area of substrate subject to wear, have much better wear resistance than homogeneously-coated hard component systems of the same or similar composition.

Preferably, the film of the invention comprises elements selected from the group consisting of groups IVa and b, Va and b, and VIa of the periodic table because these elements are similar to each other and are mixable one with the other in the solid phase. According to the invention a hard coating comprising two metallic elements, most preferably aluminium and titanium, is utilized. Thus, a preferred hard coating contains aluminium, titanium, and nitrogen. Zirconium of up to 20 atom percent and vanadium of up to 12 atom percent may be added as stabilizing agents. Of course, zirconium and vanadium also may be utilized as metallic components of the coating.

When the PVD-process is utilized, very good coating results are achieved when a rare gas, such as neon, argon, or xenon is used for target sputtering. Preferably, argon is used. More preferably, nitrogen is added as a reactive gas for creating nitrides. At an ionization level of 1 to 4 mA/cm$^2$, maintained with known ionization aids such as high temperature and several auxiliary electrodes, preferred potentials between the plasma and the substrate are between about 50 V to 150 V, preferably about 100 V. A preferred method as ionization aid is to maintain the temperature of the plasma of 150° to 550° C. depending on the substrate. When utilizing the Plasma-CVD-coating method, preferred potentials between the plasma and the substrate range from about 100 V to about 2000 V.

Typically, the metal deficiency at the edge, compared to the remainder of the coating, is about 2 atom percent, preferably about 4 atom percent, and more preferably about 6 atom percent. A coating having an aluminium concentration difference of about 10 atom percent has been prepared.

The hard compound film according to the invention can be used on substrates comprising steel, hard metals, such as tungsten carbide and tungsten carbide cobalt, cermets containing titanium, and ceramics, and combinations thereof. In certain circumstances, especially to improve resistance against mechanical shock and reduce the brittleness of the coating, it is advisable to apply a film of Ti-N, Ti-C-N, Ti-C, or the like as a primer, and then to coat the substrate with the hard compound according to the invention. Such primer films are also very hard and smooth the transition from the base material to the densified edge areas of the hard compound coating.

The following examples are intended to further illustrate the invention, not to limit it in any way. The claims are limited only by the scope of the appended claims.

EXAMPLE 1

In an argon filled vacuum chamber, drills of 8 mm diameter were coated for one hour by target sputtering. The material for the target (cathode) was a sintered titanium-aluminium composition. Nitrogen was directed into the vacuum chamber under a pre-determined partial pressure as the reactive gas. In presence of a good ionization of a few mA/cm$^2$ and with a potential of 100 V between the plasma and the substrate (the drill), a coating layer of 3 micrometers was achieved during a one hour treatment period.

A red to yellow seam was visible along all edges of the coating thus applied. This seam, which corresponded to the cutting edge of the drill, was obviously different from the remainder of the titanium-aluminium composition coating, which was the typical color of titanium nitrides and illustrated an aluminium deficiency in the edge. The concentration difference of the aluminium at the edge in the red-yellow seam compared to the remaining black-blue or black-grey layers remote from the edges, was approximately 6 atom percent.

Drills treated and coated in this way were subjected to wear behavior tests, and were compared to drill specimens which were coated with a homogeneous layer of the same hard coating having the same thickness. That is, the comparison drills had an even, uniform appearance and composition at the edges and at the faces remote from the edges. For a further comparison, drills with the same diameter coated with titanium-nitride also were tested.

The drills with the coating according to the invention had a life which was 50% higher than the life of the drills coated with the homogeneous coating and 300% higher than the life of the drills coated with the titanium-nitride film. The significant improvement in life span was attributed inter alia, to the better adherence of the coating to the substrate.

EXAMPLE 2

To confirm that visual evaluation of a substrate coated by the method of the invention could be utilized to confirm the deficiency of aluminium in a titanium-aluminium-nitride preferred coating of the invention, a cube specimen was coated under substantially the same conditions described in Example 1. All four edges of the coated top surface were red to yellow, compared to black-grey or black-blue of the remainder of the coated top surface. The other five surfaces were not coated.

FIG. 1 shows the depletion of the aluminium from one edge to the center of the top surface over a distance of 2.5 mm (2500 micrometers). The Figure illustrates that the concentration of the aluminium at the edge is about 2 mass % less than the aluminium concentration 2500 micrometers from the edge.

Figure 2:
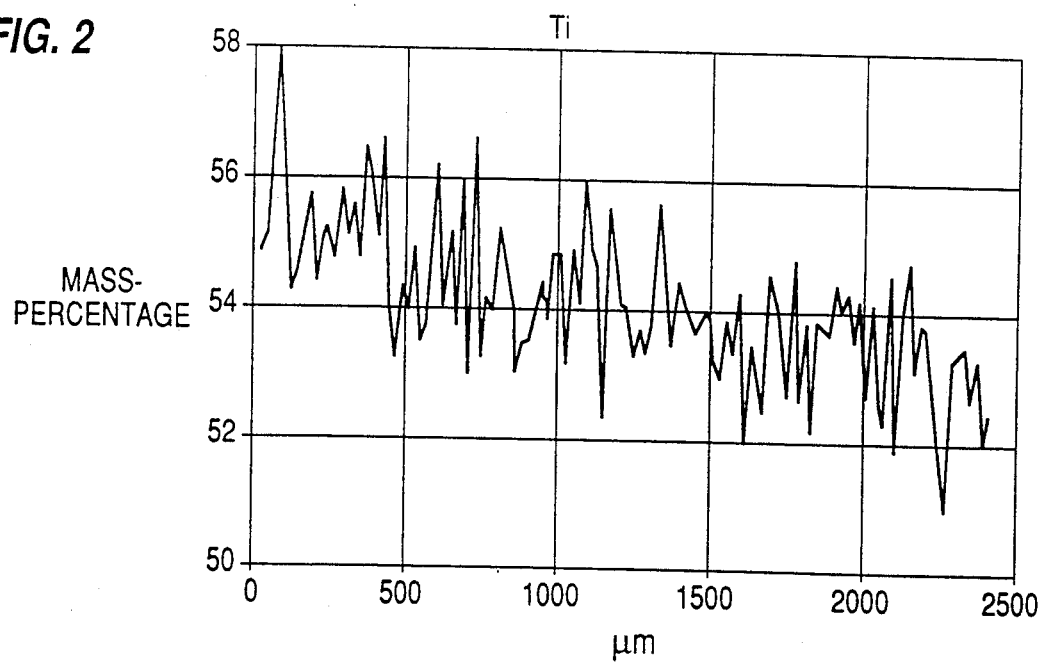
FIG. 2 illustrates the decrease in titanium concentration along the same path as FIG. 1.

FIG. 2 summarizes the titanium concentration measured along the same path, and illustrates that the titanium concentration is about 2 mass percent higher at the edge (about 55 mass percent) than it is 2500 micrometers from the edge (about 53 mass percent). Thus, this difference, is clearly identifiable by the color difference.

Although preferred embodiments of this invention have been discussed herein, those skilled in the art will appreciate that changes and modifications may be made without departing from the spirit of this invention, as defined in and limited only by the scope of the appended claims.

We claim:

1. A non-homogenous, multi-component, wear-resistant PVD- or Plasma-CVD-coating containing at least two metallic elements on a substrate having an edge subjected to wear, said coating having a concentration difference at the edge of at least about 2 atom percent of one metallic element compared to the coating remote from the edge.

2. The coating of claim 1 further containing a component selected from the group consisting of nitrogen, carbon, boron, silicon, oxygen, and blends thereof.

3. The coating of claim 1 comprising aluminium, titanium, and nitrogen.

4. The coating of claim 1 comprising zirconium, titanium, and nitrogen.

5. The coating of claim 1 wherein the substrate comprises high speed steel.

6. The coating of claim 1 wherein the substrate comprises a cermet.

7. The coating of claim 1 wherein the substrate comprises ceramic.

8. The coating of claim 1, the substrate further comprising a primer layer, said primer layer selected from the group consisting of Ti-N, Ti-C-N, Ti-C, and blends thereof.

9. The coating of claim 1 wherein the substrate comprises hard metal.

10. The coating of claim 9 wherein the hard metal is tungsten carbide.

11. A method for coating a substrate having an edge subject to wear with a non-homogenous, multi-component, metal-containing, wear-resistant coating by a PVD- or Plasma-CVD-process, said method comprising a) forming a plasma comprising ions of at least two metals in a chamber in which the pressure is subatmospheric;

b) urging the plasma toward the substrate to be deposited thereon by maintaining a difference between the electrical potential of the substrate and the electrical potential of the plasma sufficient to deposit on the substrate a non-homogeneous coating of plasma having a metal concentration of one of the metals at the edge at least about 2 atom percent different from the metal concentration remote from the edge.

12. The method of claim 11, wherein the plasma consists of ionized metal atoms and ionized metalloid atoms.

13. The method of claim 11, wherein the plasma further comprises a rare gas selected from the group consisting of neon, argon, xenon, and blends thereof.

14. The method of claim 11, further comprising introducing a component of the plasma into the vacuum chamber as a reactive gas.

15. The method of claim 11 wherein a PVD process is utilized, the plasma is maintained at a temperature above about 150° to 550° C., and the potential of the substrate is between about 50 V and 150 V compared to the potential of the plasma.

16. The method of claim 15, wherein the potential is about 100 V.

17. The method of claim 11, wherein a Plasma-CVD-process is utilized, the plasma is maintained at a temperature above about 150° to 550° C., and the potential of the substrate is between about 100 and 2000 V lower than the potential of the plasma.

18. The method of claim 17 wherein the potential of the substrate is between about 600 and 2000 V lower than the potential of the plasma.

* * * * *

UNITED STATES PATENT AND TRADEMARK OFFICE
CERTIFICATE OF CORRECTION

PATENT NO.        : 5,272,014
APPLICATION NO. : 07/382993
DATED             : December 21, 1993
INVENTOR(S)       : Toni Leyendecker et al.

It is certified that error appears in the above-identified patent and that said Letters Patent is hereby corrected as shown below:

On the Cover Page, Foreign Application Priority Data section (30):
  Please replace "Jul. 23, 1989" with --Jul. 23, 1988--

Signed and Sealed this

Seventeenth Day of April, 2007

JON W. DUDAS
*Director of the United States Patent and Trademark Office*